United States Patent [19]

Busby

[11] 4,020,485
[45] Apr. 26, 1977

[54] NON-LINEAR DIGITAL-TO-ANALOG CONVERTER FOR SERVO CIRCUIT

[75] Inventor: Edwin Stanley Busby, Menlo Park, Calif.

[73] Assignee: Ampex Corporation, Redwood City, Calif.

[22] Filed: Apr. 3, 1972

[21] Appl. No.: 240,655

[52] U.S. Cl. .................... 340/347 DA; 318/601; 235/197
[51] Int. Cl.[2] ................................... H03K 13/04
[58] Field of Search ........ 340/347 DA; 235/150.53, 235/151.11, 197; 328/144; 318/603, 604, 601

[56] References Cited

UNITED STATES PATENTS

| 3,182,302 | 5/1965 | Horn | 340/347 DA |
|---|---|---|---|
| 3,303,489 | 2/1967 | Krucoff | 340/347 DA |
| 3,307,173 | 2/1967 | Popodi et al. | 340/347 DA |
| 3,382,438 | 5/1968 | Geller | 340/347 DA X |
| 3,555,436 | 1/1971 | Elliott | 328/144 |
| 3,555,540 | 1/1971 | Hartke | 340/347 DA |
| 3,569,959 | 3/1971 | Arase | 340/347 DA |
| 3,670,326 | 6/1972 | Sloane et al. | 340/347 DA |

FOREIGN PATENTS OR APPLICATIONS 1,212,920  11/1970  United Kingdom ........ 340/347 DA Primary Examiner—Charles D. Miller

[57] ABSTRACT

A shunt-series resistive network in which the shunt elements are switched in and out of the circuit in accordance with the individual bits of a digital binary signal and wherein the values of the various resistive elements are selected to provide a network impedance which varies as a preselected expotential function of the quantity represented by the digital signal. A non-linear converter employing this network is used in a servo circuit for driving a controlled device as a non-linear expotential function of its relative position.

5 Claims, 4 Drawing Figures

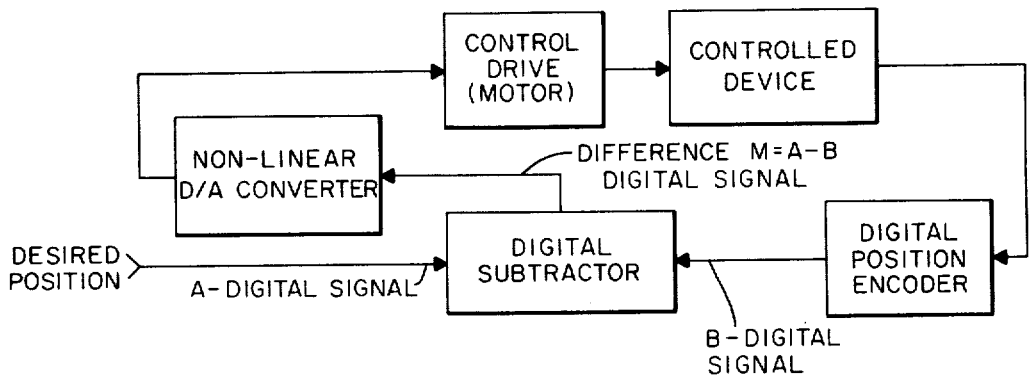
FIG_1
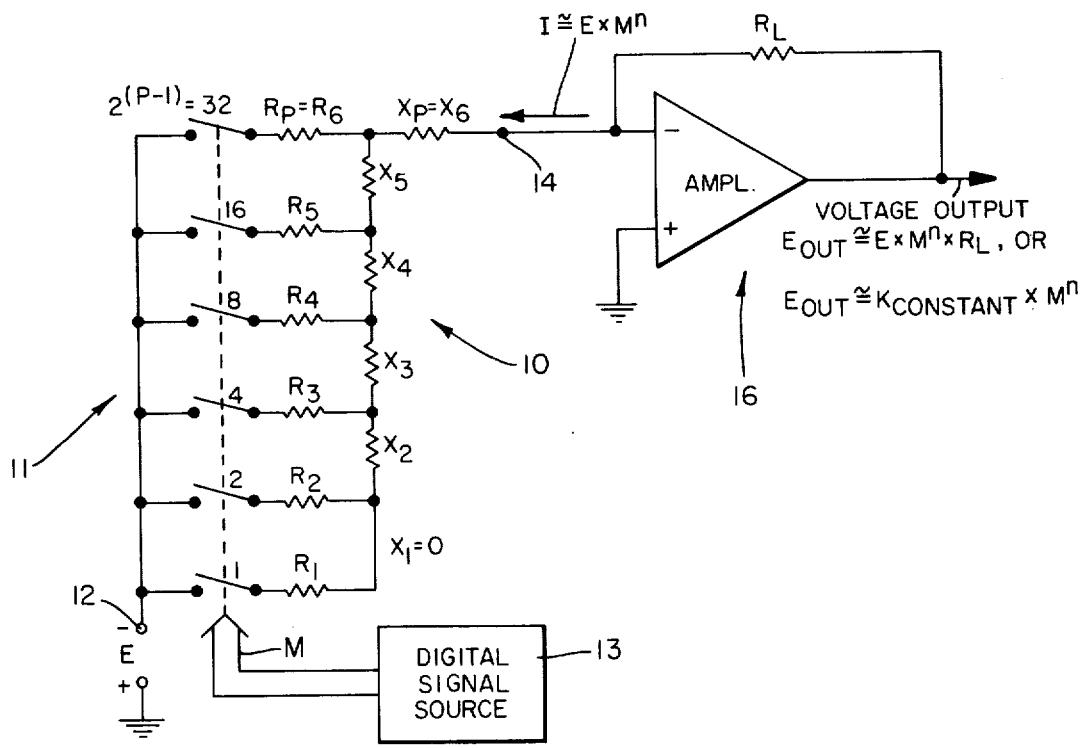
FIG_2

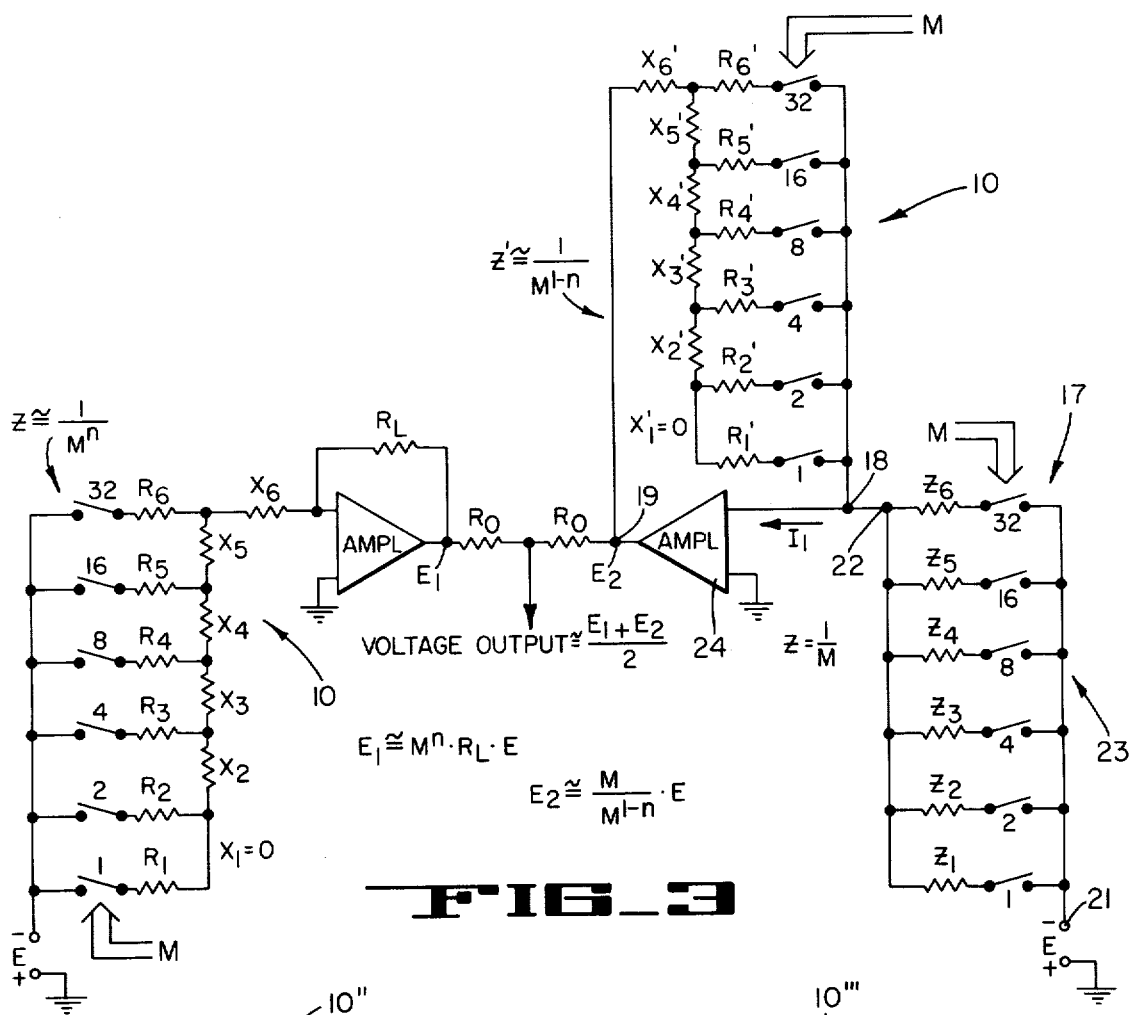
FIG_3
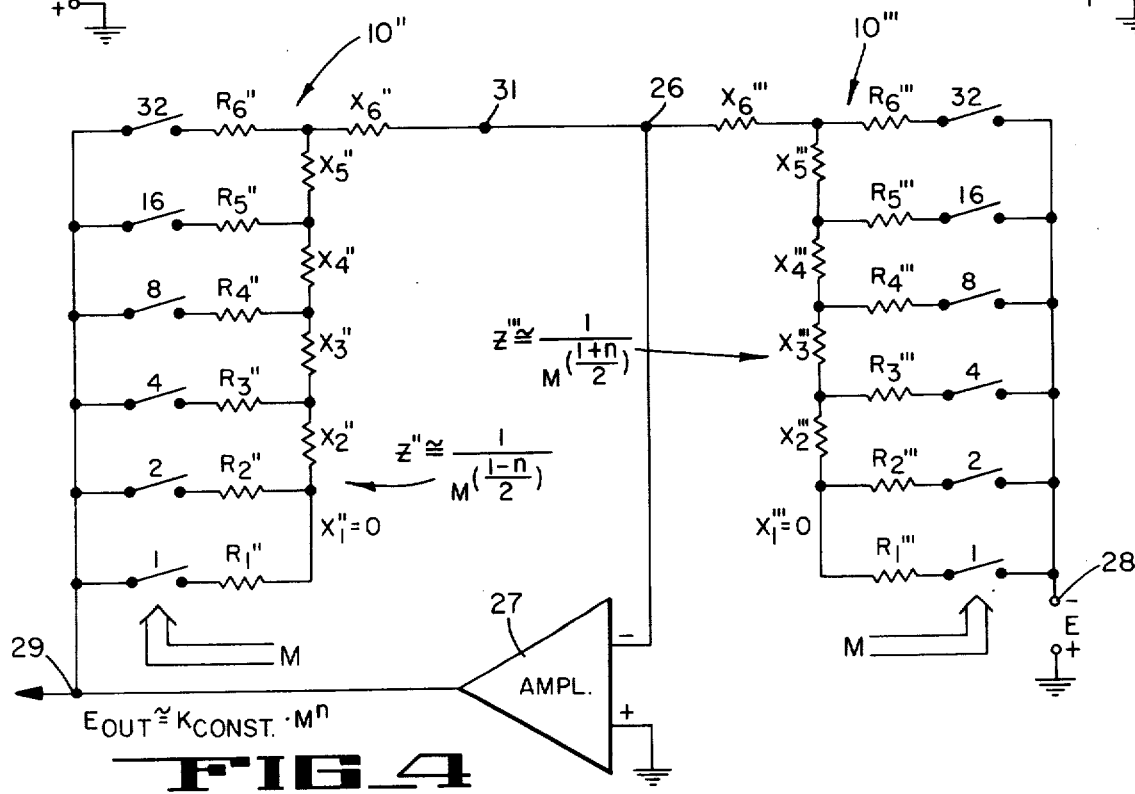
FIG_4

NON-LINEAR DIGITAL-TO-ANALOG CONVERTER FOR SERVO CIRCUIT

In general the invention relates to a digital-to-analog conversion circuit and to servo systems employing such circuits. More particularly the invention concerns a digital-to-analog converter for developing a non-linear output signal in response to a digital input signal.

Non-linear digital-to-analog conversion circuitry has general application in the electrical arts and may be employed in a variety of applications. One such application involves servo controlled systems. In the field of servo control, it is frequently necessary to provide an analog control signal in response to a digitally encoded position information signal, and to provide a non-linear analog output function in response to linear variations in the digitized quantity. While there are a number of non-linear converters capable of satisfying this operation, most of these devices are based on the use of non-linear electronic devices, such as diodes, which are not only expensive to employ but also are subject to substantial temperature instabilities.

There is a need for a low-cost, wholly reliable, stable, non-linear digital-to-analog converter capable, for example, of performing the conversion operation many times found necessary in a servo control system. Accordingly, it is an object of the present invention to provide such a converter.

The present invention is fully described in the following specification and from a reading of that specification other objects, advantages, and features of the invention will become apparent. This specification includes the attached drawings which are briefly described as follows:

FIG. 1 is a generalized block diagram illustrating a servo control system employing the non-linear digital-to-analog converter of the present invention;

FIG. 2 is a circuit diagram showing in detail the construction of the converter in accordance with the present invention;

FIG. 3 is a detailed schematic diagram showing an alternative embodiment of the basic converter shown in FIG. 2; and FIG. 4 is another alternative embodiment again employing the basic converter circuit of FIG. 2.

The conversion network of the present invention provides for generating a function which varies as the inverse of a quantity M raised to the power $n$ where M is a digital signal representing the quantity M in a binary format and where $n$ is any preselected number between zero and one. In this respect, the generated function approximates any selected monotonically decreasing curve. Thus, for example, functions may be generated in addition to that of $1/M^n$ such as $1/\sine M$ where the input does not exceed $\pi/4$ radians, and other functions having a monotonically decreasing characteristic.

With reference to FIGS. 1 and 2, the conversion network of the present invention is shown in FIG. 2 comprising a shunt-series resistive network 10 which develops the digital-to-analog conversion employed in the servo system of FIG. 1, where it is shown as the non-linear $d/a$ converter. The operation of the servo circuit of FIG. 1 will be described briefly below. Network 10 includes a set of shunt resistive elements $R_1$, $R_2$, $R_3$ — continuing with increasing subscripts to the last shunt resistive element $R_P$ which in this instance is $R_6$. These shunt elements have one of their terminal ends connected to junctions between series resistive elements $X_1$, $X_2$, $X_3$, etc., continuing to the highest order series resistor $X_P$ which in this instance is $X_6$. $X_1$ is selected to equal zero impedance.

A switching means 11 provides for selectively connecting each of the shunt elements $R_1$ through $R_P$ into and out of the network in the following manner. A separate switching device of means 11 connects individually the terminal end of each of the shunt resistors $R_1$ through $R_P$ to a first terminal 12 serving as the input wherein the various switching devices are operated by the individual bits of a digital binary signal, in this instance a signal M developed by a digital signal source 13. The least significant bit of the signal M operates the switching device associated with the lowest order shunt element $R_1$ with increasingly significant bits operating shunt elements of increasing subscript order. In this instance, the highest order bit carries a weight of 32 which is correlated to the highest order subscript P as $2^{P-1}$ power. In this instance P equals 6, and thus $2^5$ equals a weight of 32. Of course the binary weights are related to one another by the power of 2.

Moreover, in accordance with the present invention, the values of the shunt-resistive elements and series resistive elements are selected such that the network impedance between a second terminal 12 and an output terminal 14 serving as the output varies approximately as the inverse of the quantity M, represented in a binary format, raised to the power $n$, where $n$ is any preselected number between zero and one. Thus, for example, $n$ might be selected to equal one-half in which case impedance of the network between terminals 12 and 14 varies as the inverse of the square root of the quantity M. The manner in which the resistive values are selected will be described below. Since the impedance varies as the inverse of the quantity $M^n$, a current I may be realized at the output terminal 14 by connecting such terminal to the input of an operational amplifier circuit 16 including a feedback resistor $R_L$, and applying a voltage E to input terminal 12. Current I is thus approximately equal to E times $M^n$. At the output of operational amplifier circuit 16, an output voltage Eout approximately equals E times $M^n$ times $R_L$ which may be restated as a voltage Eout approximately equal to some constant, K times $M^n$ where the applied voltage E and the feedback resistor $R_L$ are both constant.

The non-linear digital-to-analog converter of FIG. 2 is applicable in the servo system of FIG. 1 in the following manner. The servo system is designed to drive a control device at a rate bearing a non-linear relation to the difference between its actual or present position and a desired position. The difference will be referred to as the relative position. This non-linear relation may typically require a square root function between the relative position and the speed at which the device is forced toward the desired position. The square root relation between the relative position and the speed of the controlled device results in a constant acceleration from the control drive, in this instance a motor, which is the most efficient mode in that the desired position of the controlled device is reached in the minimum time for an available accelerating force.

Thus, employing the conversion circuit constructed in accordance with the present invention in the servo system of FIG. 1, a digitized difference signal of quantity M is developed for application to the switching means 11 of the resistive network. A digital subtractor provides this difference signal in response to an input signal B generated by a digital position encoder representing the instantaneous position of the device in a digital format, and to a digital signal A representing the desired final position. Thus, the digital source 13 shown in FIG. 2 is provided in the FIG. 1 environment by the digital subtractor. The output of the non-linear d/a converter in FIG. 1, is thus a voltage Eout approximately equaling some constant K, times the digital difference signal M raised to the power $n$. As indicated, the power $n$ is selected to equal one-half so as to provide a square root relationship between the relative position signal M and the analog control signal applied to the control drive.

In constructing the shunt-series resistive network 10, the series resistive elements are designated $X_1$, $X_2$, — $X_P$ where the element $X_P$ in this instance being $X_6$ connects the series elements to the output terminal 14. The highest order shunt resistive element $R_P$, in this instance being $R_6$ is connected to the junction between the series element $X_P$ and $X_{P-1}$, in this instance being $X_6$ and $X_5$ respectively. Similarly, the shunt element $R_{P-1}$, in this instance $R_5$, is connected to the junction between series elements $X_{P-1}$ and $X_{P-2}$, in this instance being $X_5$ and $X_4$ respectively. In a similar manner, the remaining shunt elements are connected to the junction between each of the series resistive elements except for shunt element $R_1$ which is connected to the junction of $R_2$ and $X_2$ by the element $X_1$, where $X_1$ is selected to have zero impedance.

The values of the resistive shunt-series elements are calculated in the following manner. By assuming the actuation of adjacent pairs of the switching devices of means 11 individually and then together, and developing formulas using well-known circuitry principles, a calculation can be made for each of the various resistive values. For example, working with the pair of switching devices in FIG. 2 associated with shunt resistors $R_6$ and $R_5$ the following formulations result: assume that:

$$a = \frac{E}{(M=16)^n}$$

$$b = \frac{E}{(M=32)^n}$$

$$c = \frac{E}{(M=32+16)^n}$$

then, $$X_6 = c - \sqrt{c^2 + ab - bc - ac}$$

and $$R_6 = b - X_6$$

Moving on the next pair of adjacent switching devices assume that:

$$a_1 = \frac{E}{(M=8)^n}$$

$$b_1 = \frac{E}{(M=16)^n}$$

$$c_1 = \frac{E}{(M=16+8)^n}$$

then, $$X_5 = c_1 - \sqrt{c_1^2 + a_1 b_1 - b_1 c_1 - a_1 c_1 - R_6}$$

and $$R_5 = b_1 - X_6 - X_5$$

etc.

The following may be reduced to the following general equations where A is a function of the power $n$ and the voltage E applied across the network:

$$A = E(1 - \sqrt{(3^n - 1)(1.5^n - 1)})$$

and, $$X_P = \frac{A}{(3 \cdot 2^{(P-2)})^n}$$

$$X_{P-1} = \frac{A}{(3 \cdot 2^{(P-3)})^n} - X_P$$

$$X_4 = \frac{A}{12^n} - X_5 \cdot \cdot - X_P$$

$$X_3 = \frac{A}{6^n} - X_4 - X_5 \cdot \cdot - X_P$$

$$X_2 = \frac{A}{3^n} - X_3 - X_4 - X_5 \cdot \cdot - X_P$$

and, $$R_1 = 1 - X_2 - X_3 - X_4 \cdot \cdot - X_P$$

$$R_2 = \frac{1}{2^n} - X_2 - X_3 - X_4 \cdot \cdot - X_P$$

$$R_3 = \frac{1}{4^n} - X_3 - X_4 \cdot \cdot - X_P$$

$$R_{P-1} = \frac{1}{(2^{(P-2)})^n} - X_{P-1} - X_P$$

$$R_P = \frac{1}{(2^{(P-1)})^n} - X_P$$

by calculating and setting the values for each of the shunt-series resistive elements in this way, an impedance is provided by network 10 which closely approximates the inverse of the digital quantity M raised to the power $n$. The quantity M is, of course, applied to the circuit by operating the switches in accordance with the individual bit condition of the digital source. For example, if the quantity M is equal to 1, the least significant bit will be binary 1 and remaining bits a binary 0, so as to operate the switching device having the weight 1 thereby connecting shunt resistor $R_1$ into the network. For M equal to the quantity 2, the switching device weighted 2 will be closed by the bit condition in the binary number so as to connect shunt resistor $R_2$ into the circuit. For M equals 3, the switching device having a weight 1 and the device having a weight of 2 are closed, etc. As the digital quantity M increases, the overall impedance of the network decreases by reason of additional switching devices of switching means 11 being closed connecting additional shunt elements into the network.

Impedances exactly equaling the generated function $1/M^n$ are achieved for input quantities of M which are equal to zero and whole number powers of 2, such as 1, 2, 4, 8, 16, etc. This is also true for input quantities of M which are 3/2 of multiples of 2, such as 3, 6, 12, 24, etc. Other input values of M produce a current function which deviates from the precise mathematical function.

Typical peak percentage deviation errors for an exponent $n = 0.5$ are as follows:

$M = 5 — + 2.9\%$ $M = 7 — - 2.6\%$ $M = 9 — + 3.9\%$ $M = 15 — - 4.5\%$ $M = 18 — + 3.9\%$ $M = 31 — - 5.7\%$ $M = 37 — + 4\%$ $M = 63 — - 6.3\%$

As indicated from the above, accurate results are obtained as the binary quantity M decreases below the quantity 5. Thus, in the servo system environment of FIG. 1, the present invention functions advantageously to provide accurate servoing as the control device approaches its final or desired position. Conversely for the largest values of M for which all or most of the switching devices of means 11 are actuated, the largest deviations occur in the function generated from the ideal mathematical function. These errors of greater magnitude for larger values of M however do not seriously detract from the operation of the converter in the servo system because a coarse control signal will still drive the controlled device toward its desired position.

For general applications and for certain servo systems in which the above discussed deviations from the ideal are unacceptable, alternative circuit embodiments of the present invention such as those shown in FIGS. 3 and 4 are employed. With reference to FIG. 3, a non-linear digital-to-analog conversion circuit is provided for developing an output function nominally the same as the function generated by network 10 in FIG. 2, but having a more exacting output. In particular, the output function developed by the same network 10 as discussed in connection with FIG. 2 is averaged with the output function provided by an additional shunt-series resistive network 10' combined with a shunt resistive network 17 having a linear digital-to-analog output. The average output signal is provided as indicated at the junction of a pair of equal valued resistors $R_0$, each conducting a separate output voltage $E_1$ and $E_2$ from the respective networks. The voltage $E_1$ is the same as indicated at the output of the operational amplifier circuit in FIG. 2 and is equal approximately to some constant $K_1$ times $M^n$. The voltage $E_2$ developed by networks 10' and 17 is approximately equal to some constant $K_1$ times the quantity $M/M^{1-n}$ which reduces to $M^n$. However because of the different mode by which the $E_2$ output signal is developed, the deviations therein from the ideal function are substantially equal and opposite to the above discussed deviations in the output voltage function $E_1$. Thus the average of the output voltage functions is provided by the averaging network comprised of the pair of $R_0$ resistors and follows more precisely the exact mathematical function.

Network 10' is a shunt-series resistive network having the same configuration as network 10 but differing therefrom in that the values of the shunt and series resistive elements are calculated by using a quantity $1-n$ in lieu of the quantity $n$ as the exponent. Thus in the above formulas for the resistive values, the quantity $n$ is replaced by a new quantity $n'$ equaling $1-n$. All other input signals and operating characteristics are the same for network 10' as described for network 10 in FIG. 2.

The resulting impedance variation $Z'$ occurring between input and output terminals 18 and 19, is thus the inverse of M raised to the $1-n$ power. Shunt resistive network 17 is a conventional digital-to-analog conversion network in which the shunt impedances $Z_1, Z_2 — Z_P$ (in this instance equaling $Z_6$) are selected to bear a power of 2 relationship to one another such that the resulting impedance between terminals 21 and 22 is proportional to 1/M. In network 17, the quantity M is the same as that provided in networks 10 and 10' and the increasingly significant individual bits of the digital signal representing M operate a switching means 23 so as to connect the resistive elements of increasing subscript order. The values of elements $Z_1$ through $Z_P$ are selected to decrease in value by a power of Z factor with higher ordered subscripts such as $Z_1$ equals 1, $Z_2$ equals ½, $Z_3$ equals ¼, $Z_4$ equals ⅛, $Z_5$ equals 1/16 and $Z_6$ equals 1/32. A voltage E is applied to terminal 21 of network 17 and the terminal 22 is connected to the input of an operational amplifier 24.

Shunt-series network 10' is connected as a feedback impedance between the input and output of amplifier 24 as indicated at terminals 18 and 19, and such feedback impedance varies approximately as the inverse of M raised to the $n-1$ power. A voltage E is applied to terminal 21 of the network 17 and terminal 22 of this network is connected to an input of operational amplifier 24 so as to develop a current $I_1$ which is directly proportional to the quantity M. In accordance with well-known operational amplifier principles, the output voltage is proportional to the ratio between the input and feedback impedance such that the output voltage function $E_2$ is in turn proportional to $M/M^{1-n}$ which reduces to $M^n$, the same as the function developed by network 10. However, the deviations in the output function $E_2$ are opposite to those in the function developed by network 10 and thus the average of the output signals $E_1$ and $E_2$ provide a closer approximation to the ideal mathematical function.

With reference to FIG. 4, a further alternative embodiment is illustrated for compensating for the deviations in the output function of a network 10 from the ideal. In this instance, a pair of shunt-series resistive networks 10", and 10''' are employed having the same construction and operation as the network 10 associated with FIGS. 2 and 3. Differing from the network 10 circuit, however, the network 10" has its shunt and resistive values selected such that the impedance between its input and output terminals varies as $1/M$ $(1-n)/2$, while network 10''' is designed to provide an impedance variation approximately equal to $1/M$ $(1+n)/2$. In calculating the values for each of these networks, a quantity $n''$ and a quantity $n'''$ are substituted for $n$ in the value formulas. $n''$ is substituted for $n$ in the above formulas for network 10", where $n'' = (1-n)/2$. For network 10''', a new quantity $n'''$ equal to $(1+n)/2$ is substituted for the quantity $n$. In each case, the objective is to obtain an output signal which varies as the function the power $n$, however, the resistive values are calculated in accordance with the quantities $n''$ and $n'''$.

Network 10''' is connected at an output terminal 26 to the input of an operational amplifier 27 and a voltage E is applied to an input terminal 28 as shown. Network 10" on the other hand is connected with its input and output terminals 29 and 31 between the input and output of amplifier 27 and thus as a feedback impedance thereacross. As a result of this construction, an output voltage Eout is obtained at the output of amplifier 27 proportional to the ratio of the impedances of the networks which reduces to an output proportional to $M^n$. As the percentage impedance errors contributed by each circuit are nearly equal, the ratio between the two impedances and hence the output voltage is substantially free of the individual network impedance errors.

What is claimed is:

1. A non-linear digital to analog converter comprising a first terminal; a second terminal; a plurality of series resistive elements serially connected together and coupled between said first and second terminals; a plurality of shunt resistive elements each having one of its ends coupled to one of said terminals and the other of its ends coupled in circuit with said series elements to form a shunt series resistive network between said first and second terminals in which each shunt element is coupled to the other of said terminals through at least one series element, said series resistive elements being designated $X_1, X_2 — X_P$ and the element $X_P$ connecting said series elements to said other terminal, said shunt resistive elements being designated $R_1, R_2 — R_P$ with the element $R_P$ being connected to the junction between series elements $X_P$ and $X_{P-1}$, shunt element $R_{P-1}$ being connected to the junction between series elements $X_{P-1}$ and $X_{P-2}$ etc., —, shunt element $R_2$ being connected to the junction of elements $X_2$ and $X_1$, and element $X_1$ connecting $R_1$ to the junction of elements $X_1$ and $X_2$; and a switching means in said network coupled in series with each of said shunt elements and said one terminal and operative to selectively switch shunt elements into the network in accordance with a digital signal representing a quantity M, each switching means responsive to the state of one digit position of said digital signal, said switching means including a separate switching device connecting each of said shunt elements individually to said one terminal with the switching device connected to $R_1$ being responsive to the least significant digit position of said digital signal and the switching devices connected to shunt elements of increasingly higher order subscripts being responsive to digit positions of increasing significance, the values of said resistive elements are selected such that the network impedance varies approximately as the inverse of the quantity M raised to the power $n$ where $n$ is any preselected number between zero and one and in accordance with the following formulas, where E is a voltage applied across the first and second terminals of the network and A is a function of the power $n$ and the voltage E:

$$A = E(1 - \sqrt{(3^n - 1)(1.5^n - 1)})$$

and, $$X_P = \frac{A}{(3.2^{(P-2)})^n}$$

$$X_{P-1} = \frac{A}{(3.2^{(P-3)})^n} - X_P$$

$$X_4 = \frac{A}{12^n} - X_5 \cdots - X_P$$

$$X_3 = \frac{A}{6^n} - X_4 - X_5 \cdots - X_P$$

-continued $$X_2 = \frac{A}{3^n} - X_3 - X_4 - X_5 \cdots - X_P$$

$$X_1 = 0$$

and, $$R_1 = 1 - X_2 - X_3 - X_4 \cdots - X_P$$

$$R_2 = \frac{1}{2^n} - X_2 - X_3 - X_4 \cdots - X_P$$

$$R_3 = \frac{1}{4^n} - X_3 - X_4 \cdots - X_P$$

$$R_{P-1} = \frac{1}{(2^{(P-2)})^n} - X_{P-1} - X_P$$

$$R_P = \frac{1}{(2^{(P-1)})^n} - X_P.$$

2. A non-linear digital to analog converter comprising a first terminal; a second terminal; a first shunt series resistive network connected between said first and second terminals including a plurality of series resistive elements serially connected together and coupled between said first and said second terminals, a plurality of shunt resistive elements each having one of its ends coupled to one of said terminals and the other of its ends coupled in circuit with said series elements so that each shunt element is coupled to the other of said terminals through at least one series element, a switching means in said network coupled in series with each of said shunt elements and said one terminal and operative to selectively switch shunt elements into the network in accordance with a digital signal representing a quantity M, each switching means responsive to the state of one digit position of said digital signal, the values of said resistive elements are selected to provide a network impedance that non-linearly varies monotonically as the inverse of the quantity M; a first amplifier circuit means defining an input circuit and an output circuit and whose gain is principally determined by the ratio of a first impedance means in said output circuit to a second impedance means in said input circuit, said first impedance means is a resistive element having a fixed value, and said first shunt series resistive network forms said second impedance means; an additional amplifier circuit means; an additional shunt series resistive network forming the first impedance means of said additional amplifier circuit means; a shunt resistive network having a first terminal, a second terminal, a plurality of shunt connected resistive elements coupled between said first and second terminals of the shunt resistive network, and a switching means coupled in series with each of said shunt connected resistive elements and operative to selectively switch shunt connected resistive elements into the shunt resistive network; and an averaging circuit means coupled to the output circuits of said first named and additional amplifier circuit means for averaging the signals received therefrom, said switching means in said first named and additional shunt series resistive networks and said shunt resistive network coupled to be operated together in accordance with said digital signal, the values of said resistive elements of said networks are selected to provide a shunt resistive network impedance that varies as the inverse of the quantity M and so that the ratio of first and second impedance means of said first named amplifier circuit means is equal to that of said additional amplifier circuit means.

3. The non-linear converter of claim 2 further defined as said first named shunt series resistive network having the values of the resistive elements therein selected such that the network impedance varies approximately as the inverse of the quantity M raised to the power $n$ where $n$ is any preselected number between zero and one, said additional shunt series resistive network having the values of the resistive elements therein selected such that the network impedance non-linearly varies approximately as the inverse of the quantity M raised to the power $1-n$, and said shunt resistive network having the values of the shunt resistive elements therein selected such that the network impedance non-linearly varies as the inverse of the quantity M.

4. A non-linear digital to analog converter comprising a first terminal; a second terminal; a first shunt series resistive network connected between said first and second terminals including a plurality of series resistive elements serially connected together and coupled between said first and said second terminals, a plurality of shunt resistive elements each having one of its ends coupled to one of said terminals and the other of its ends coupled in circuit with said series elements so that each shunt element is coupled to the other of said terminals through at least one element, a switching means in said network coupled in series with each of said shunt elements and said one terminal and operative to selectively switch shunt elements into the network in accordance with a digital signal representing a quantity M, each switching means responsive to the state of one digit position of said digital signal, the values of said resistive elements are selected to provide a network impedance that non-linearly varies monotonically as the inverse of the quantity M; an amplifier circuit means defining an input circuit and an output circuit and whose gain is principally determined by the ratio of a first impedance means in said output circuit to a second impedance means in said input circuit, said first shunt series resistive network forming said first impedance means; and an additional shunt series resistive network forming said second impedance means, said switching means in said first named and additional networks coupled to be operable together in accordance with said digital signal, the variation of the network impedance of said first named network relative to the quantity M different from that of said additional network, the values of said resistive elements of said networks are selected so that said ratio of first and second impedance means varies as said selected conversion function.

5. The non-linear converter of claim 4 further defined as said first named network having the values of the resistive elements therein selected such that the network impedance non-linearly varies approximately as the inverse of the quantity M raised to the power $(1+n)/2$, and said additional network having the value of the resistive elements therein selected such that the network impedance non-linearly varies approximately as the inverse of the quantity M raised to the power $(1-n)/2$.

* * * * *